United States Patent [19]

Kim

[11] Patent Number: 5,510,286
[45] Date of Patent: Apr. 23, 1996

[54] METHOD FOR FORMING NARROW CONTACT HOLES OF A SEMICONDUCTOR DEVICE

[75] Inventor: Jae K. Kim, Kyoungki, Rep. of Korea

[73] Assignee: Hyundai Electronics Industries Co., Ltd., Kyoungki, Rep. of Korea

[21] Appl. No.: 502,305

[22] Filed: Jul. 13, 1995

[30] Foreign Application Priority Data

Jul. 14, 1994 [KR] Rep. of Korea ........................ 94-16961

[51] Int. Cl.$^6$ ........................................ H01L 21/44
[52] U.S. Cl. ........................ 437/50; 437/195; 437/228; 437/924; 148/DIG. 111; 148/DIG. 102
[58] Field of Search ........................ 437/44, 50, 52, 437/187, 195, 228, 984, 924; 148/DIG. 111, DIG. 102

[56] References Cited

U.S. PATENT DOCUMENTS

| | | | |
|---|---|---|---|
| 4,502,914 | 3/1985 | Trumpp et al. | 156/643 |
| 5,256,587 | 10/1993 | Jun et al. | 437/47 |
| 5,290,723 | 3/1994 | Tani et al. | 437/48 |
| 5,310,693 | 5/1994 | Hsue | 437/52 |
| 5,397,723 | 3/1995 | Shiroto | 437/228 |
| 5,429,967 | 7/1995 | Hong | 437/52 |
| 5,429,988 | 7/1995 | Huang et al. | 437/50 |

FOREIGN PATENT DOCUMENTS

| | | |
|---|---|---|
| 60-254733 | 12/1985 | Japan . |
| 62-137862 | 6/1987 | Japan . |

Primary Examiner—George Fourson
Assistant Examiner—Thomas G. Bilodeau
Attorney, Agent, or Firm—Morgan & Finnegan

[57] ABSTRACT

A method comprising the steps of forming an insulating film on a semiconductor substrate in which a certain infrastructure is built, forming a series of conductive wirings on the insulating film, forming a blanket interlayer insulating film over the resulting structure, forming first photoresist film patterns on the interlayer insulating film, the side walls of said patterns each being located above the conductive wirings, forming sacrificial film spacers at the side walls of the first photoresist film patterns, forming second photoresist film patterns on the interlayer insulating film between the sacrificial film spacers, and forming contact holes to expose areas of the conductive wirings by sequentially removing the sacrificial spacers and the thus exposed areas of the interlayer insulating film, which results in an improvement in the operating reliability of semiconductor devices and the production yield as well as the high integration of devices.

4 Claims, 2 Drawing Sheets

METHOD FOR FORMING NARROW CONTACT HOLES OF A SEMICONDUCTOR DEVICE

BACKGROUND OF THE INVENTION

1. Field of the Invention

The present invention relates, in general, to a method for forming contact holes of a semiconductor device and, more particularly, to a method for forming contact holes with a size of not more than the resolution limit by a sacrificial film spacer technique which results in an improvement in the operating reliability of semiconductor devices and the production yield as well as the high integration of devices.

2. Description of the Prior Art

High integration of semiconductor devices forces contact holes, which interconnect lower and upper wirings or capacitors, to be reduced in size. The distances between contact holes and peripheral wirings are required to be reduced, as well. In contrast, the aspect ratio of contact holes, the ratio of diameter to depth, is increased. Thus, an accurate and strict arrangement of contact holes should be constructed in the semiconductor devices in which multilayer conductive wirings are formed, with reduced process allowance. Reduction of contact holes in size requires semiconductor device manufacturing apparatuses to be more precise. With current apparatuses, it is very difficult to form fine patterns having a size of, for example, 0.4 μm or less.

In order to make the contact holes distant from one another, they should be formed according to a certain design rule between contact hole masks in consideration of the following factors: first, misalignment tolerance upon mask arrangement; second, lens distortion upon light exposure process; third, critical dimension variation upon mask manufacture and photolithography; and fourth, registration between the masks.

It is very difficult to highly integrate devices because the above consideration factors seem highly likely to force the size of contact holes themselves and the distance therebetween to be increased over the limits of the resolution of photoresist film patterns.

In addition, since the distance between conductive wirings should also be formed in consideration of the overlapping with the contact holes, the width of the conductive wirings as well as the distance increases and thereby serves as a factor to make the high integration of devices difficult.

SUMMARY OF THE INVENTION

Accordingly, it is a principal object of the present invention to provide a method for forming contact holes of a semiconductor device which are, in size, not more than the resolution limit of the photoresist film patterns.

It is another object of the present invention to provide a method capable of highly integrating devices.

Based on the intensive and thorough research by the present inventors, the above object could be accomplished by providing a method for forming contact holes of a semiconductor device, comprising the steps of: forming an insulating film on an infrastructure of a semiconductor device; forming conductive wirings on the insulating film; forming a blanket interlayer insulating film over the surface of the resulting structure; forming first photoresist film patterns on the interlayer insulating film, the side walls of said first photoresist film patterns each being located above the conductive wirings; forming sacrificial film spacers at the side walls of the first photoresist film patterns; forming second photoresist film patterns on the interlayer insulating film between the sacrificial film spacers; and forming contact holes by sequentially removing the sacrificial film spacers and then, the thus exposed areas of the interlayer insulating film, in sequence, with the first and the second photoresist film patterns serving as a mask.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENT

Figure 1A:
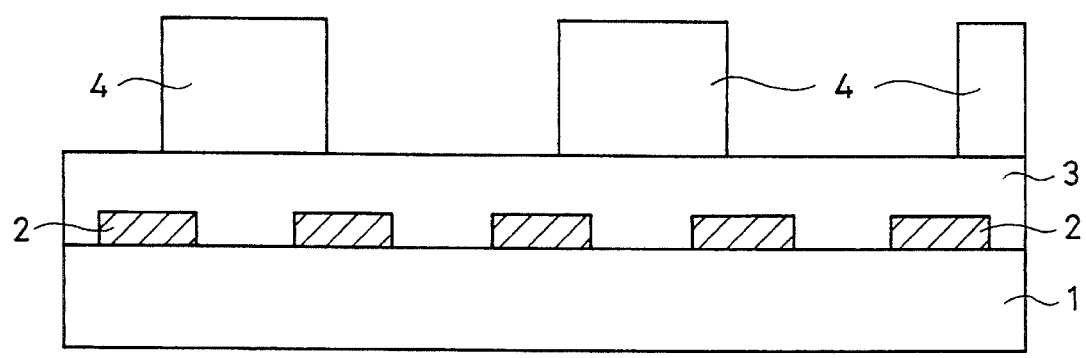
FIGS. 1A to 1C are schematic cross sectional views showing a method for forming contact holes of a semiconductor device, according to the present invention.

The application of the preferred embodiment of the present invention is best understood with reference to the accompanying drawings, wherein like reference numerals are used for like and corresponding parts, respectively.

Referring to FIG. 1A, there are shown conductive wirings 2 that are covered with a blanket interlayer insulating film 3 on an insulating film 1 formed over a certain infrastructure, i.e. a semiconductor substrate in which element isolating films, gate electrodes and source electrodes are formed. Thereafter, on the interlayer insulating film 3 are formed first photoresist film patterns 4, each overlapping with neighboring two conductive wirings 2 below. For planarization, the interlayer insulating film 3 is preferably formed of boro phospho silicate glass (hereinafter referred to as "BPSG"), a material superior in flowing property.

Figure 1B:
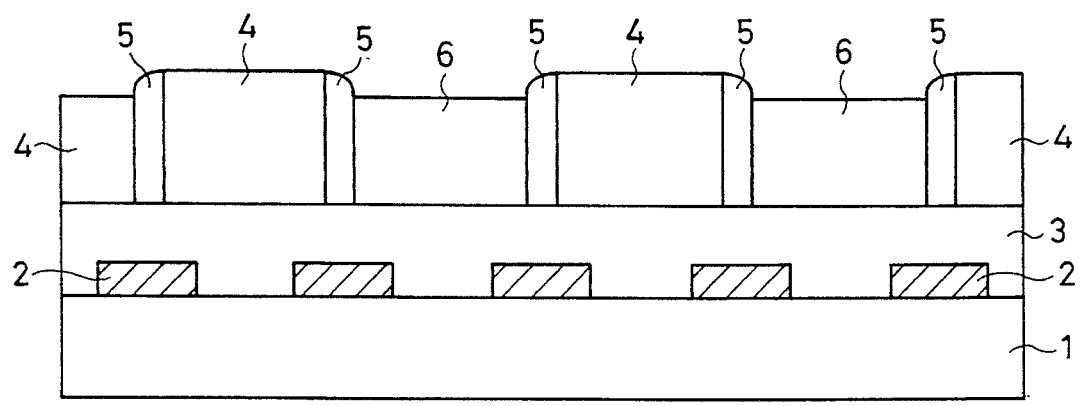

With reference to FIG. 1B, a sacrificial film is formed over the resulting structure and subjected to anisotropic etch, to form sacrificial film spacers 5 at the side walls of the first photoresist film patterns 4. Then, a photoresist film is coated on the surface of the resulting structure and subjected to etch back to an extent to expose an upper portion of the sacrificial film spacer 5, so as to form second photoresist film patterns 6. The sacrificial film is formed of an oxide film with a thickness of not more than the limit of the resolution of the photoresist film patterns, for example, 0.05 to 0.3 μm, at a temperature of 150° to 300° C.

Figure 1C:
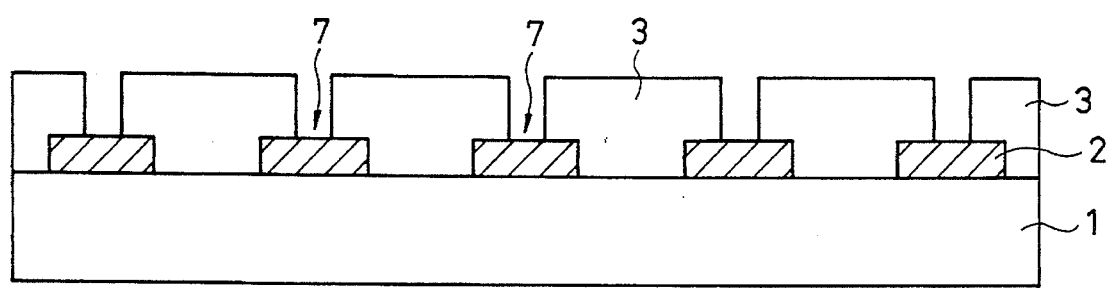

With reference to FIG. 1C, the sacrificial film spacers 5 are removed and, while the first and the second photoresist film patterns 4 and 6 serve as a mask, an etch process is undertaken to form contact holes 7 through which an area of the conductive wiring 2 is exposed. Thereafter, the first and the second photoresist film patterns 4 and 6 are removed.

As described hereinbefore, the present invention is distinguished by a characteristic method comprising the steps of forming an insulating film on a semiconductor substrate in which a certain infrastructure is built, forming a series of conductive wirings on the insulating film, forming a blanket interlayer insulating film over the resulting structure, forming first photoresist film patterns on the interlayer insulating film, the side walls of said patterns each being located above the conductive wirings, forming sacrificial film spacers at the side walls of the first photoresist film patterns, forming second photoresist film patterns on the interlayer insulating film between the sacrificial film spacers, and forming contact holes to expose areas of the conductive wirings by sequentially removing the sacrificial spacers and the thus exposed areas of the interlayer insulating film. According to the method, the width of the conductive wirings and the distance therebetween may not be formed largely in consideration of the overlapping with the contact holes but may be formed at a size near the resolution limit of the photoresist film patterns. Besides, in accordance with the method, the contact holes, although formed at a size of not more than the resolution limit of the photoresist film patterns, can maintain the overlapping with the conductive wirings, thereby highly integrating devices.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for forming contact holes of a semiconductor device, comprising the steps of:

forming an insulating film on an infrastructure of a semiconductor device;

forming conductive wirings on the insulating film;

forming a blanket interlayer insulating film over the surface of the resulting structure;

forming first photoresist film patterns on the interlayer insulating film, the side walls of said first photoresist film patterns each being located above the conductive wirings;

forming sacrificial film spacers at the side walls of the first photoresist film patterns;

forming second photoresist film patterns on the interlayer insulating film between the sacrificial film spacers; and forming contact holes by sequentially removing the sacrificial film spacers and then, the thus exposed areas of the interlayer insulating film, in sequence, with the first and the second photoresist film patterns serving as a mask.

2. A method in accordance with claim 1, wherein said sacrificial film spacers are formed of an oxide film.

3. A method in accordance with claim 2, wherein said oxide film is formed at a temperature of about 150° to 300° C.

4. A method in accordance with claim 2, wherein said oxide film has a thickness of about 0.05 to 0.3 µm.

* * * * *